(12) United States Patent
Zhang et al.

(10) Patent No.: US 10,692,992 B2
(45) Date of Patent: Jun. 23, 2020

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Huan Yun Zhang, Shanghai (CN); Jian Wu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/258,287

(22) Filed: Jan. 25, 2019

(65) Prior Publication Data
US 2019/0245064 A1    Aug. 8, 2019

(30) Foreign Application Priority Data
Feb. 6, 2018    (CN) .......................... 2018 1 0117271

(51) Int. Cl.
| H01L 29/66 | (2006.01) |
| H01L 29/78 | (2006.01) |
| H01L 29/08 | (2006.01) |
| H01L 21/28 | (2006.01) |
| H01L 21/266 | (2006.01) |
| H01L 21/306 | (2006.01) |
| H01L 29/51 | (2006.01) |

(52) U.S. Cl.
CPC ...... *H01L 29/66795* (2013.01); *H01L 21/266* (2013.01); *H01L 21/28194* (2013.01); *H01L 21/30604* (2013.01); *H01L 29/0847* (2013.01); *H01L 29/517* (2013.01); *H01L 29/66545* (2013.01); *H01L 29/785* (2013.01); *H01L 29/7851* (2013.01)

(58) Field of Classification Search
CPC ............. H01L 29/66795; H01L 29/785; H01L 29/66545; H01L 29/517; H01L 21/30604; H01L 21/28194
See application file for complete search history.

(56) References Cited

U.S. PATENT DOCUMENTS 9,614,086 B1 *   4/2017   Yeo ....................... H01L 23/535

\* cited by examiner

*Primary Examiner* — Anthony Ho
(74) *Attorney, Agent, or Firm* — Anova Law Group, PLLC

(57) ABSTRACT

Semiconductor device and fabrication method are provided. The fabrication method includes: providing a base substrate having a first gate dielectric film thereon; forming a first gate electrode layer on a portion of the first gate dielectric film; forming an offset sidewall film on the first gate dielectric film and covering sidewalls of the first gate electrode layer; forming lightly doped regions in the base substrate on sides of the first gate electrode layer; removing the offset sidewall film and a portion of the first gate dielectric film to form a first dielectric layer under the first gate electrode layer; forming sidewall spacers; forming source/drain doped regions on sides of the first gate electrode layer; forming a dielectric layer over the source/drain doped regions and the base substrate; and forming a gate opening in the dielectric layer by removing the first gate electrode layer and the first gate dielectric layer.

17 Claims, 10 Drawing Sheets

SEMICONDUCTOR DEVICE AND FABRICATION METHOD THEREOF

CROSS-REFERENCE TO RELATED APPLICATION

This application claims the priority of Chinese Patent Application No. 201810117271.3 filed on Feb. 6, 2018, the contents of which are incorporated herein by reference in their entirety.

TECHNICAL FIELD

The present disclosure generally relates to the field of semiconductor technologies and, more particularly, relates to semiconductor devices and fabrication methods.

BACKGROUND

A metal-oxide-semiconductor (MOS) transistor is one of the most important devices in contemporary integrated circuits. Basic structure of the MOS transistor includes: a semiconductor substrate; a gate structure on a surface of the semiconductor substrate; a doped source region in the semiconductor substrate on one side of the gate structure and a doped drain region in the semiconductor substrate on the other side of the gate structure. In the MOS transistor, a voltage is applied on the gate structure to a control current flowing through a channel at a bottom of the gate structure and to produce on/off switch signals.

With continuous development of semiconductor technologies, conventional planar MOS transistors have poor ability to control the channel current and a severe leakage current problem. A fin field effect transistor (FinFET) is a newly developed multi-gate device. A FinFET includes a fin protruding from the surface of the semiconductor substrate, a gate structure covering a portion of the top surface and sidewall of the fin, a source doped region in the fin on one side of the gate structure and a drain doped region in the fin on the other side of the gate structure.

However, semiconductor devices made of either planar MOS transistor or FinFET have poor performance.

SUMMARY

One aspect of the present disclosure provides a fabrication method for semiconductor devices with improved performance. The fabrication method includes: providing a base substrate, having a first gate dielectric film on the base substrate surface; forming a first gate electrode layer on a portion of the first gate dielectric film; forming an offset sidewall film on the first gate dielectric film, where the offset sidewall film covers sidewalls of the first gate electrode layer; forming lightly doped regions in the base substrate on sides of the first gate electrode layer after forming the offset sidewall film; removing the offset sidewall film and removing a portion of the first gate dielectric film such that a remaining portion of the first gate dielectric film is under the first gate electrode layer and as a first gate dielectric layer; forming sidewall spacers, which cover sidewall surfaces of both the first gate electrode layer and the first gate dielectric layer; forming source/drain doped regions in the base substrate on sides of each of the first gate electrode layer, the gate dielectric layer and the sidewall spacers; forming a dielectric layer over the source/drain doped regions and the base substrate, where the dielectric layer covers sidewall surfaces of the sidewall spacers; forming a gate opening in the dielectric layer by etching off the first gate electrode layer and the first gate dielectric layer, where sidewall spacers remain on sidewalls of the gate opening.

Another aspect of the present disclosure provides a semiconductor device. The device includes a base substrate, a gate structure formed on the base substrate, raised source/drain doped regions, and a dielectric layer. The raised source/drain doped regions are formed in and above the base substrate and on sides of the gate structure. The dielectric layer covers the base substrate, the raised source/drain doped regions, and outside sidewall surfaces of the sidewall spacers. The gate structure further includes a gate opening and sidewall spacers formed on sidewalls and a portion of a bottom of the gate opening, in which the opening has an upper width greater than a bottom width.

Other aspects or embodiments of the present disclosure can be understood by professionals skilled in the art in light of the description, the claims, and the drawings of the present disclosure.

BRIEF DESCRIPTION OF THE DRAWINGS

The following drawings are merely for illustrative purposes according to various embodiments and are not intended to limit the scope of the present disclosure.

DETAILED DESCRIPTION

Reference will be made in detail to exemplary embodiments of the disclosure, which are illustrated in the accompanying drawings. Wherever possible, the same reference numbers will be used throughout the drawings to refer to the same or like parts.

FIGS. 1 to 5 illustrate schematic structures corresponding to certain stages for fabricating a semiconductor device.

Figure 1:
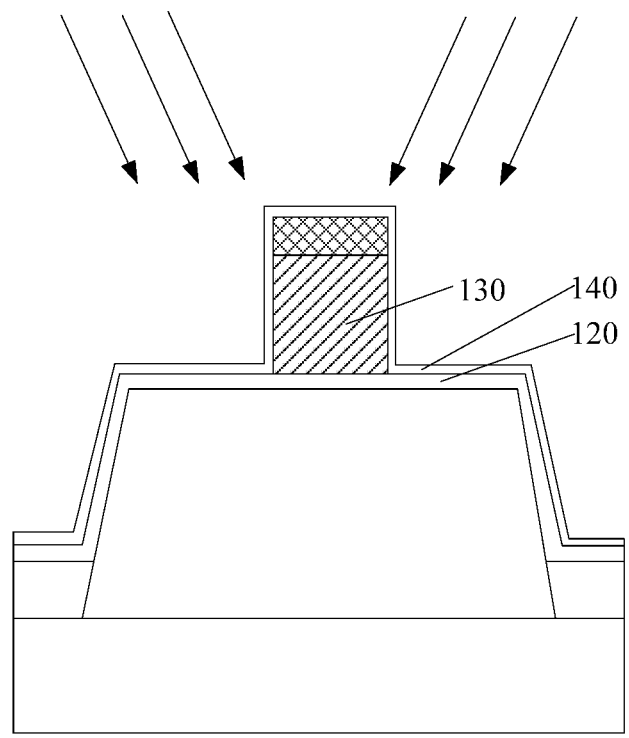
FIGS. 1 to 5 illustrate schematic structures corresponding to certain stages for fabricating a semiconductor device.

Referring to FIG. 1, a base substrate is provided, where the base substrate includes a gate dielectric film 120. A gate electrode layer 130 is formed on a portion of the gate dielectric film 120. An offset sidewall film 140 is formed on the gate dielectric film 120, where the offset sidewall film 140 covers sidewalls of the gate electrode layer 130. A light doping of ions is implanted into the base substrate on each side of the gate electrode layer 130 to form lightly doped regions.

Figure 2:
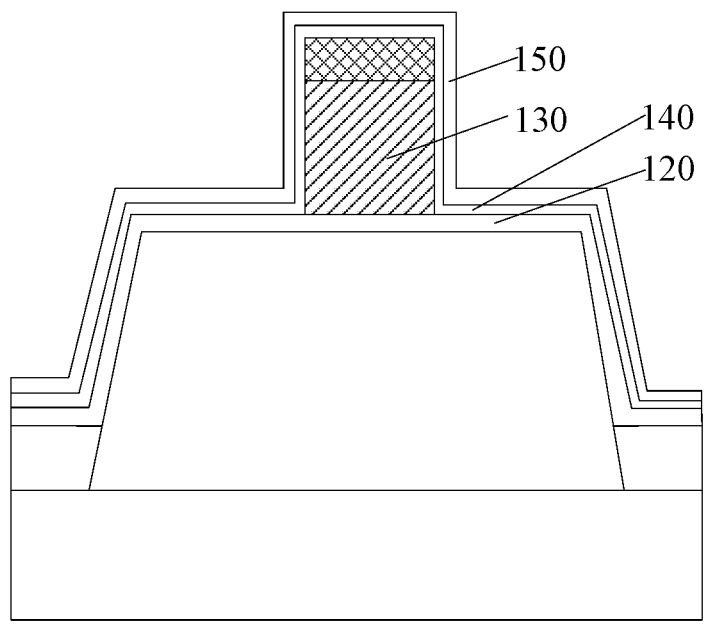
Figure 3:
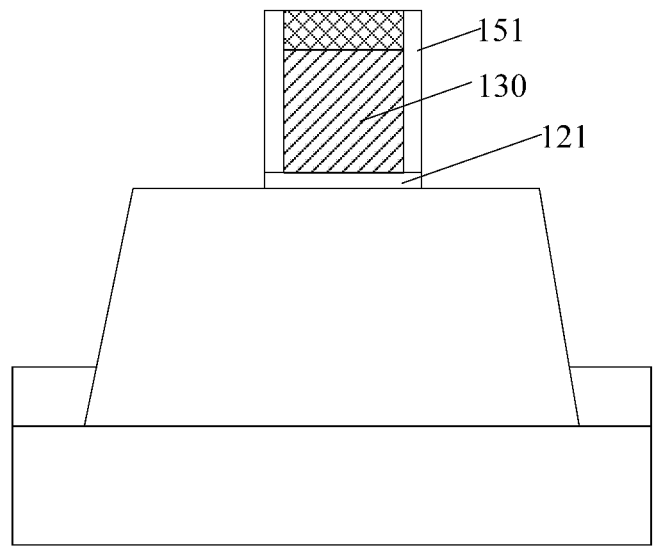

Referring to FIG. 2, after forming the lightly doped regions, a sidewall spacer film 150 is formed on the offset sidewall film 140. Referring to FIG. 3, the sidewall spacer film 150, the offset sidewall film 140, and the gate dielectric film 120, shown in FIG. 2 are etched back until a base substrate is exposed, thereby forming gate sidewalls 151 and a gate dielectric layer 121. The gate sidewalls 151 are on the sidewalls of the gate electrode layer 130, and the gate dielectric layer 121 is under both the gate electrode layer 130 and the gate sidewalls 151.

Figure 4:
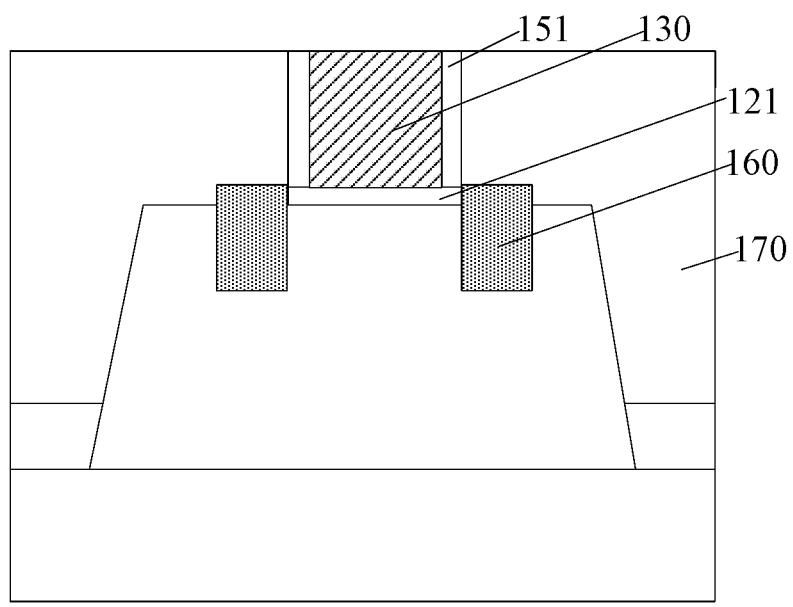

Referring to FIG. 4, source/drain doped regions 160 are formed in the base substrate on sides of the gate electrode layer 130. For example, the source/drain doped regions 160 are formed on sides of the gate dielectric layer 121 and the gate sidewalls 151. A dielectric layer 170 is formed on the base substrate and on the source/drain doped regions 160. The dielectric layer 170 covers sidewall surfaces of the gate sidewalls 151.

Figure 5:
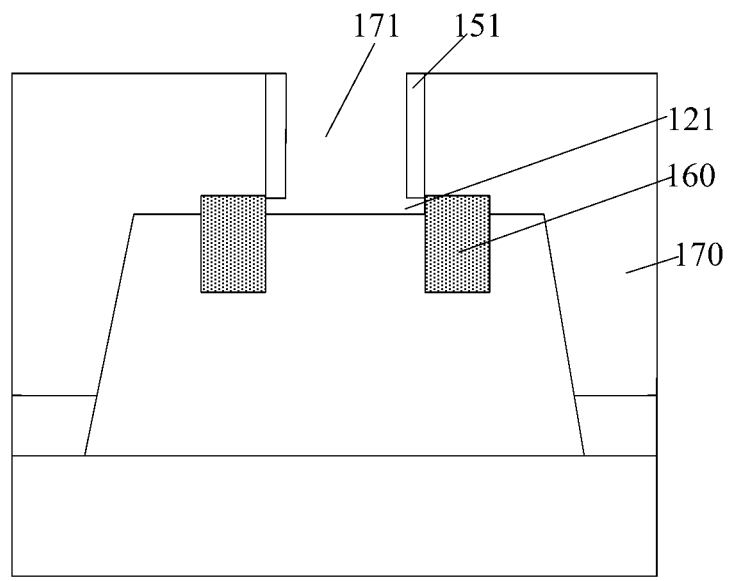

Referring to FIG. 5, both the gate electrode layer 130 and the gate dielectric layer 121, shown in FIG. 4, are etched off, thereby forming a gate opening 171.

However, semiconductors fabricated by above processes have poor performance. For example, the offset sidewall film 140 is on the gate dielectric film 120, making the offset sidewall film 140 not in direct contact with the base substrate. The gate dielectric film 120 under sidewalls of the gate electrode layer 130 functions as stress buffer for the offset sidewall film 140 covering the sidewalls of the gate electrode layer 130, thereby avoiding high stress damages to the base substrate from the offset sidewall film 140.

The gate dielectric layer 121 is positioned under both the gate electrode layer 130 and the gate sidewalls 151; the gate sidewalls 151 do not cover sidewalls of the gate dielectric layer 121. There is a gap between the gate sidewalls 151 and the base substrate after removing the gate electrode layer 130 and the gate dielectric layer 121, resulting in an etching on the dielectric layer 170 through the gap along the bottom of the gate sidewall 151 when removing the gate electrode layer 130 and the gate dielectric layer 121 by the etching. The additional etching of the dielectric layer 170 exposes the source/drain doped region 160, causing current leakage and reducing performance of the semiconductor device.

The present disclosure provides a semiconductor device and a fabrication method of the semiconductor device. The semiconductor device may be formed by, forming a first gate electrode layer on a portion of a first gate dielectric film; forming an offset sidewall film on the first gate dielectric film, where the offset sidewall film covers sidewalls of the first gate electrode layer; forming lightly doped regions on the base substrate; then removing the offset sidewall film and a portion of the first gate dielectric film surrounding the first gate electrode layer, thereby the first gate dielectric film under the first gate electrode layer becoming the first gate dielectric layer; forming sidewall spacers that cover all the sidewall surfaces of both the first gate electrode layer and the first gate dielectric layer; forming source/drain doped regions and the dielectric layer; and forming a gate opening in the dielectric layer by etching off both the first gate electrode layer and the first gate dielectric layer. The semiconductor device made by this fabrication method has improved performance.

The purpose, characteristics, and advantages of the semiconductor device fabricated according to the present disclosure will now be made in detail as exemplary embodiments, which are illustrated with the accompanying drawings.

FIGS. 6 to 13 illustrate schematic structures corresponding to certain stages for fabricating an exemplary semiconductor device according to various embodiments of the present disclosure.

Figure 6:
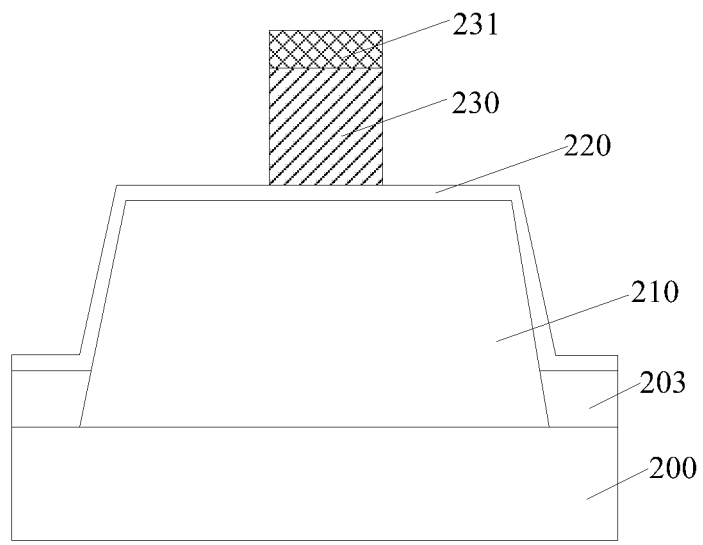
FIGS. 6 to 13 illustrate schematic structures corresponding to certain stages for fabricating an exemplary semiconductor device according to various embodiments of the present disclosure.
Figure 14:
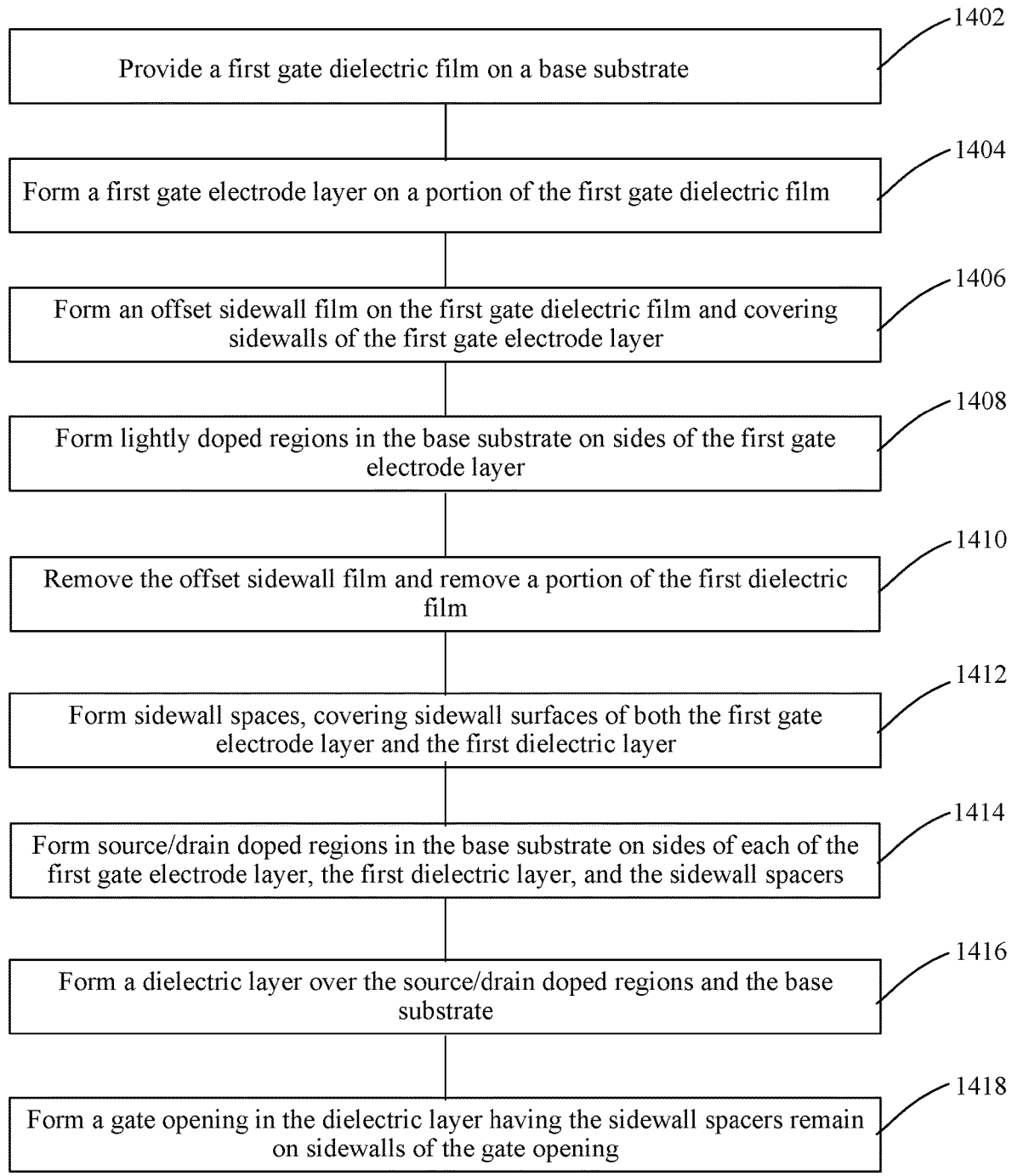
FIG. 14 illustrates an exemplary method for fabricating a semiconductor device according to various embodiments of the present disclosure.

Referring to FIG. 6, a base substrate is provided and includes a first gate dielectric film 220 (e.g., in 1402 of FIG. 14).

In one embodiment, the semiconductor device is a FinFET transistor. The base substrate includes a semiconductor substrate 200 and a fin 210 on the semiconductor substrate 200. In other embodiments, the semiconductor devices may be planar MOS transistors and substrates may be planar semiconductor substrates.

In various embodiments, the semiconductor substrate 200 may be made of single crystal silicon, polycrystalline silicon, or amorphous silicon; and the semiconductor substrate 200 may also be made from semiconductor materials such as silicon, germanium, silicon germanium, and gallium arsenide. In one embodiment, the semiconductor substrate 200 is made of silicon.

An isolation structure 203 is formed on the semiconductor substrate 200. The isolation structure 203 covers a portion of the sidewalls of the fin 210; the height of the isolation structure 203 is lower than top surface of the fin 210. The isolation structure 203 serves to electrically insulate the fin 210. In one embodiment, the isolation structure 203 may be made of silicon oxide material.

In one embodiment, the first gate dielectric layer 220 may be made of silicon oxide material. In one embodiment, the first gate dielectric film 220 covers surface of the isolation structure 203 and surface of the fin 210. The process for forming the first gate dielectric film 220 may include a deposition process.

In other embodiments, the first gate dielectric film may cover surface of the fin only; and the process for forming the first gate dielectric film may include an oxidation process.

The surface of a portion of the fin 210 which is above the isolation structure is covered by the first gate dielectric film 220.

Referring again to FIG. 6, a first gate electrode layer 230 is formed on a portion of the first gate dielectric film 220 (e.g., in 1404 of FIG. 14). For example, the first gate electrode layer 230 may be made of polycrystalline silicon material.

The process for forming the first gate electrode layer 230 includes: forming a first gate electrode film (not shown) on the first gate dielectric film 220; and etching a portion of the first gate electrode film until a surface of the first gate dielectric film 220 is exposed, thereby forming the first gate electrode layer 230.

A gate mask protection layer 231 is formed on the top surface of the first gate electrode layer 230. The gate mask protection layer 231 may be made of material selected from silicon nitride, silicon oxynitride, carbon silicon oxynitride, nitroborosilicate, and/or nitrocarbon borosilicate.

Figure 7:
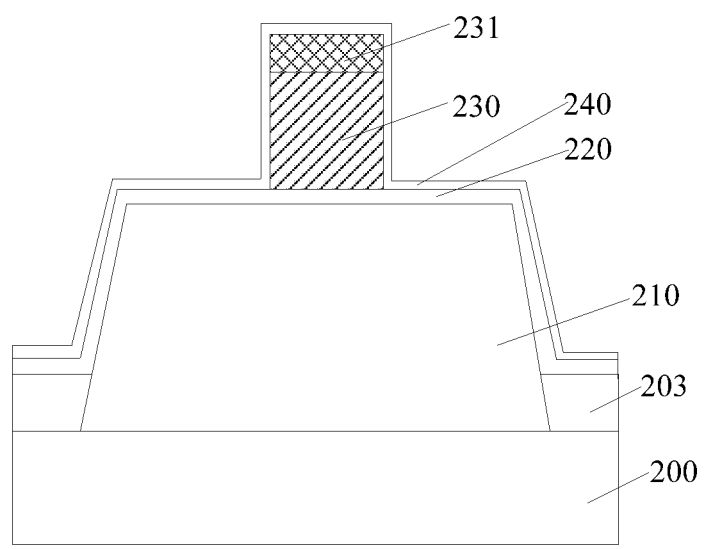

Referring to FIG. 7, an offset sidewall film 240 is formed on the first gate dielectric film 220 (e.g., in 1406 of FIG. 14). The offset sidewall film 240 covers sidewalls of the first gate electrode layer 230.

The offset sidewall film 240 may be made of material selected from silicon nitride, silicon oxynitride, carbon silicon oxynitride, nitroborosilicate, or nitrocarbon borosilicate.

The offset sidewall film 240 may also be formed on top of the first gate electrode layer 230. More specifically, the offset sidewall film 240 may be formed on the top surface and the sidewall surface of the gate mask protection layer 231.

The process for forming the offset sidewall film 240 may include a deposition process, for example, an atomic layer deposition process.

When subsequently forming the lightly doped regions, the offset sidewall film 240 covers sidewalls of the first gate electrode layer 230 to provide the following functions. The offset sidewall film 240 may be used as a mask in the ion implantation process, protecting the first gate electrode layer 230, and defining the spacing between the subsequently-formed lightly doped regions and the first gate electrode layer 230.

The offset sidewall film 240 is not in direct contact with the base substrate, as the offset sidewall film 240 is formed on the first gate dielectric film 220. In one embodiment, the offset sidewall film 240 is not in direct contact with any surface portion of the fin 210 located under sidewalls of the first gate electrode layer 230. The first gate dielectric film 220 under sidewalls of the first gate electrode layer 230 provides a stress buffer for the offset sidewall film 240 covering the sidewalls of the first gate electrode layer 230, thereby avoiding stress caused damages to the surface of the fin 210 from the offset sidewall film 240.

Figure 8:
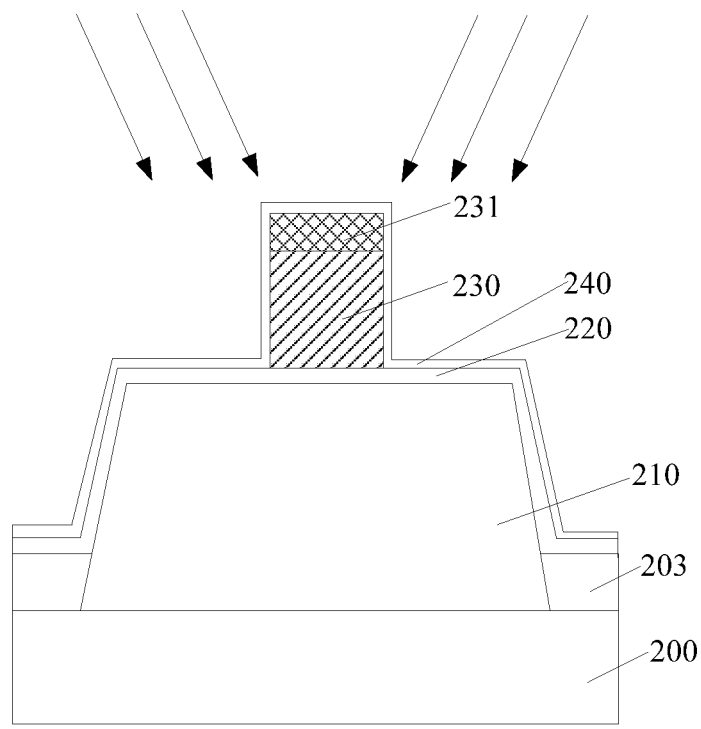

Referring to FIG. 8, after forming the offset sidewall 240, lightly doped regions (not shown) are formed in the base substrate on each side of the first gate electrode layer 230 (e.g., in 1408 of FIG. 14).

The process of forming lightly doped regions includes: implanting a light doping of ions in the base substrate on each side of the first gate electrode layer 230 by an ion implantation process using the offset sidewall film 240 that covers sidewalls of the first gate electrode layer 230 as a mask to form the lightly doped regions.

A light doping of ions is implanted in the fins 210 on each side of the first gate electrode layer 230, thereby forming lightly doped regions in the fins 210 on each side of the first gate electrode layer 230. The lightly doped regions are also on each side of the offset sidewall film 240 covering sidewalls of the first gate electrode layer 230.

Figure 9A:
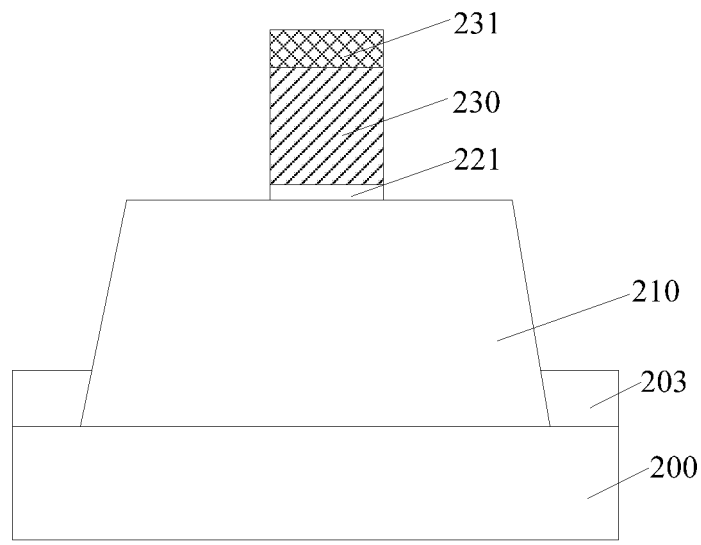
Figure 9B:
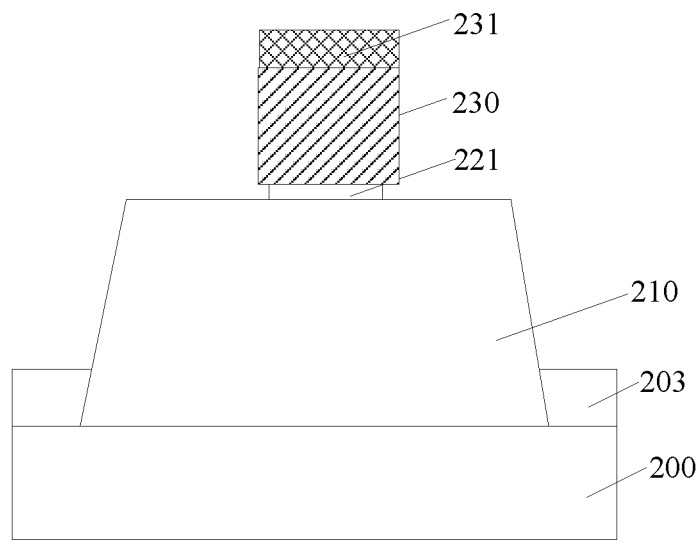

Referring to FIG. 9, after forming the lightly doped regions, the offset sidewall film 240 and the first gate dielectric film 220 surrounding the first gate electrode layer 230 are removed, thereby the first gate dielectric film 220 under the first gate electrode layer 230 becoming the first gate dielectric layer 221 (e.g., in 1410 of FIG. 14). In one embodiment, as shown in FIG. 9A, along a direction of the channel length, the first gate electrode layer 230 and the first gate dielectric layer 221 have an equal width. In another embodiment, as shown in FIG. 9B, along a direction of the channel length, width of the first gate dielectric layer 221 is less than width of the first gate electrode layer 230.

The first gate dielectric layer 221, for example, may be an In/Out Gate Oxide (IOGOX).

The process for removing the offset sidewall film 240 and removing the first gate dielectric film 220 surrounding the first gate electrode layer 230 includes: removing the offset sidewall film 240 followed by removing the first gate dielectric film 220 surrounding the first gate electrode layer 230. For example, the removal process of the offset sidewall film 240 may include a wet etching process.

In one embodiment, the offset sidewall film 240 may be made of silicon nitride, which may be etched by a wet etching process including phosphate acid as the etching solution.

The removal process of a portion of the first gate dielectric film surrounding the first gate electrode layer 230 may also include a wet etching process. For example, the wet etching processes may include hydrofluoric acid as the etching solution.

In one embodiment, when removing the first gate dielectric film 220 surrounding the first gate electrode layer 230, a portion of the first gate dielectric film 220 under the first gate electrode layer 230 is also removed, thereby the remaining first gate dielectric film 220 under the first gate electrode layer 230 becoming the first gate dielectric layer 221. The first gate dielectric layer 221 therefore has a dimension less than the first gate electrode layer 230 along a direction of the channel length.

That the dimension of the first gate dielectric layer 221 is less than the dimension of the first gate electrode layer 230 along a direction of the channel length provides the following advantages. As a width of the first gate electrode layer may be maintained fixed or unchanged, the channel length is decreased, thereby decreasing the channel electrical resistance and increasing the drive current of the semiconductor device. The width of the first gate electrode layer is greater than the width of the first gate dielectric layer. A relatively wide first gate electrode layer results in a relatively wide gate opening on the top after a subsequent process of removing the first gate electrode layer and the first gate dielectric layer. The wide gate opening on the top benefits in a subsequent process of filling in materials for both a second gate electrode layer and a second gate dielectric layer. Also a wide width of the first gate electrode layer leads to a wide top width of the subsequently formed second gate electrode layer, which makes it easier for aligning a subsequently-formed conductive plug with the second gate electrode layer.

In one embodiment, along the direction of the channel length, a ratio of the dimension of the first gate dielectric layer 221 to the dimension of the first gate electrode layer 230 is about 70% to about 85%. The selection of this ratio is based on the following considerations: if the ratio is greater than 85%, the reduction in the channel length is decreased, thereby providing a less degree of the reduction in the channel electrical resistance; if the ratio is less than 70%, a distance between the source/drain doped regions on sides of the first gate electrode layer 230 may be overly small, which easily causes a punch-through of the depletion layers, between the channel region and each of source/drain regions on sides of the first gate electrode layer.

In other embodiments, only the first gate dielectric film 220 surrounding the first gate electrode layer 230 is removed. Correspondingly, along the direction of the channel length, the dimension of the first gate dielectric layer 221 may be equal to the dimension of the first gate electrode layer 230.

Figure 10:
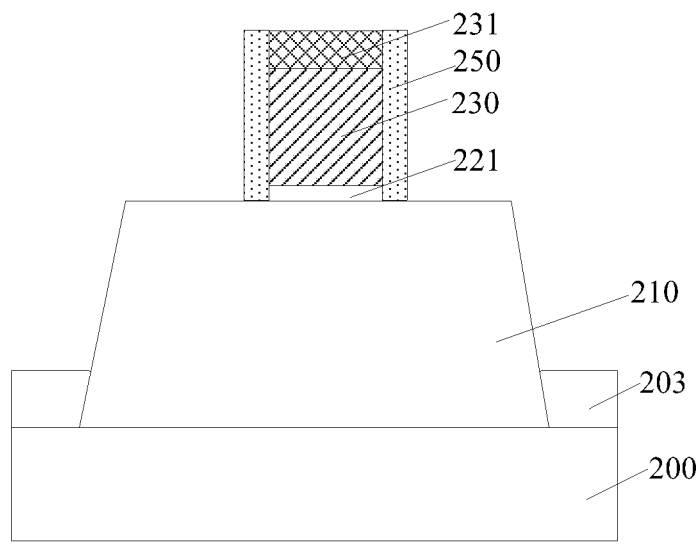

Referring to FIG. 10, sidewall spacers 250 are formed, where the sidewall spacers 250 cover sidewalls of both the first gate electrode layer 230 and the first gate dielectric layer 221 (e.g., in 1412 of FIG. 14).

The sidewall spacers 250 may be made of a material selected from silicon nitride, silicon oxynitride, carbon silicon oxynitride, nitroborosilicate, and/or nitrocarbon borosilicate.

The sidewall spacers 250 may be thicker than the offset sidewall film 240.

When forming the source/drain doped regions, the sidewall spacers 250 provide the following functions. The sidewall spacers 250 may be used to define spacings between later formed source/drain doped regions and either layer of the first gate electrode layer 230 and the first gate dielectric layer 221; and protecting sidewalls of both the first gate electrode layer and the first gate dielectric layer.

In one embodiment, the sidewall spacers 250 is thicker than the offset sidewall films 240, thereby making distance between the later formed source/drain doped regions and the first gate electrode layer 230 greater than distance between the lightly doped regions and the first gate electrode layer 230.

Before forming the sidewall spacers 250, the first gate dielectric layer 220 surrounding the first gate electrode layer 230 is removed, thereby the sidewall spacers 250 cover sidewalls of both the first gate electrode layer 230 and the first gate dielectric layer 221.

The process of forming the sidewall spacers 250 includes: forming a sidewall spacer film on the base substrate surface, on sidewall surfaces of both the first gate electrode layer 230 and the first gate dielectric layer 221, and on top of the first gate electrode layer 230 (not shown); and etching back the sidewall spacer film until a surface of the base substrate is exposed.

The sidewall spacer film may also be formed on the surfaces of top and sidewall of the gate mask protection layer 231. The sidewall spacer film is etched back until exposing top surface of the gate mask protection layer 231 and surface of the fin 210, thereby forming the sidewall spacers 250.

In one embodiment, along the direction of the channel length, the dimension of the first gate dielectric layer 221 is less than the dimension of the first gate electrode layer 230. Thus, the sidewall spacers 250 have greater thickness on the first gate dielectric layer 221 than on the first gate electrode layer 230. Therefore, thickness of the sidewall spacers 250 attached to sidewalls of the first gate dielectric layer 221 is increased, which may further reduce parasitic capacitance generated between the second gate electrode layer and the source/drain regions after subsequent formations of the second gate dielectric layer and the second gate electrode layer. The sidewall spacers 250 are less thick on the sidewalls of the first gate electrode layer 230 than on the sidewalls of the first gate dielectric layer 221, which is beneficial for a subsequent process of filling in dielectric materials.

In other embodiments, along the direction of the channel length, the dimensions of the first gate dielectric layer 221 and of the first gate electrode layer may be equal. Correspondingly, the sidewall spacers have equal thickness on the sidewalls of the first gate dielectric layer as on the sidewalls of the first gate electrode layer.

Figure 11:
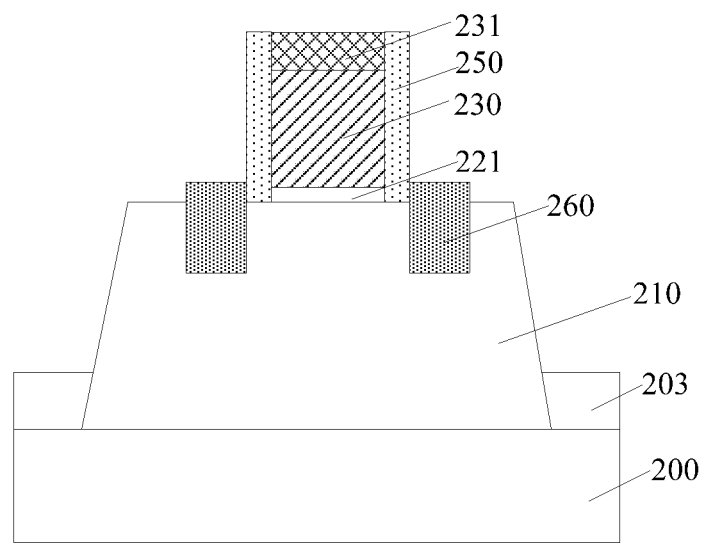

Referring to FIG. 11, source/drain doped regions 260 are formed in the base substrate on sides of each of the first gate electrode layer 230, the first gate dielectric layer 221, and the sidewall spacers 250 (e.g., in 1414 of FIG. 14).

The source/drain doped regions 260 may be formed in the fin 210 on sides of each of the first gate electrode layer 230, the first gate dielectric layer 221, and the sidewall spacers 250.

The process for forming the source/drain doped regions 260 includes: forming recesses in the base substrate on sides of each of the first gate electrode layer 260, the first gate dielectric layer 221, and the sidewall spacers 250; and in the recesses growing source/drain doped regions 260 outwardly.

In one embodiment, the source/drain doped regions 260 may have top surfaces above overall surface level of the base substrate under the first gate electrode layer 230. Accordingly, the source/drain doped regions 260 may have top surfaces above the fin 210, thereby forming elevated source/drain doped regions 260.

In other embodiments, the source/drain doped regions 260 may have top surfaces at the same level as the fin 210.

In one embodiment, the source/drain doped regions 260 are elevated so to be in contact with the sidewall spacer 250.

Figure 12A:
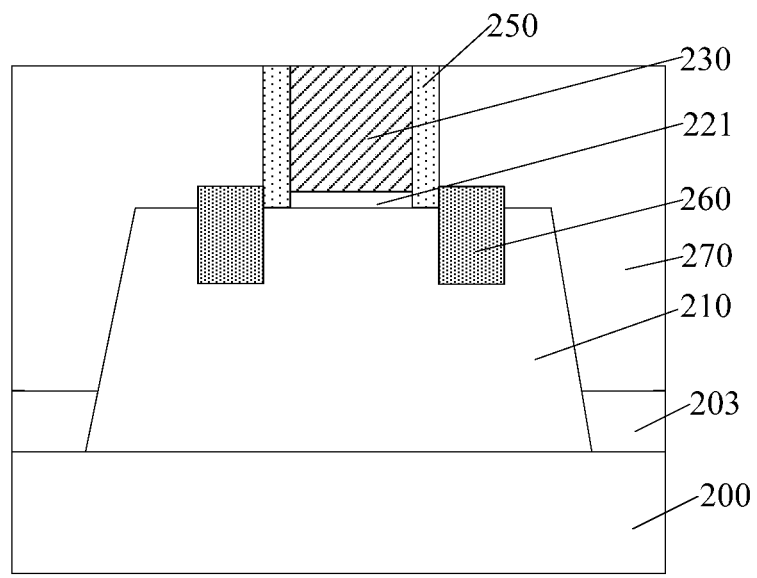
Figure 12B:
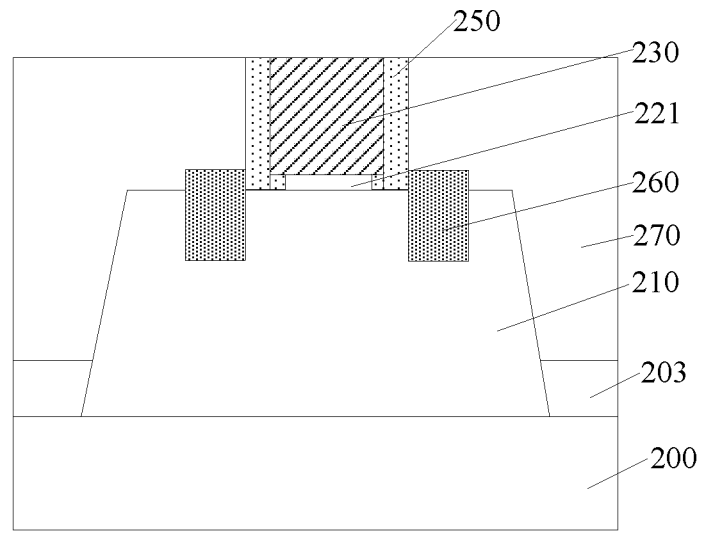

Referring to FIG. 12, a dielectric layer 270 is formed over the source/drain doped regions 260 and on the base substrate (e.g., in 1416 of FIG. 14). The dielectric layer 270 covers outside sidewall surfaces of the sidewall spacers 250. In one embodiment, as shown in FIG. 12A, the first gate electrode layer 230 and the first gate dielectric layer 221 have equal width along a direction of the channel length, leading to a uniform thickness of the sidewall spacers 250. In another embodiment, as shown in FIG. 12B, width of the first gate electrode layer 230 is greater than width of the first gate dielectric layer 221 along a direction of the channel length, leading to a thickness of the sidewall spacers 250 greater at the bottom than on the top.

The dielectric layer 270 may be made of a silicon oxide material.

In one embodiment, when forming the dielectric layer 270, the gate mask protection layer 231 is removed to expose top surface of the first gate electrode layer 230.

Figure 13A:
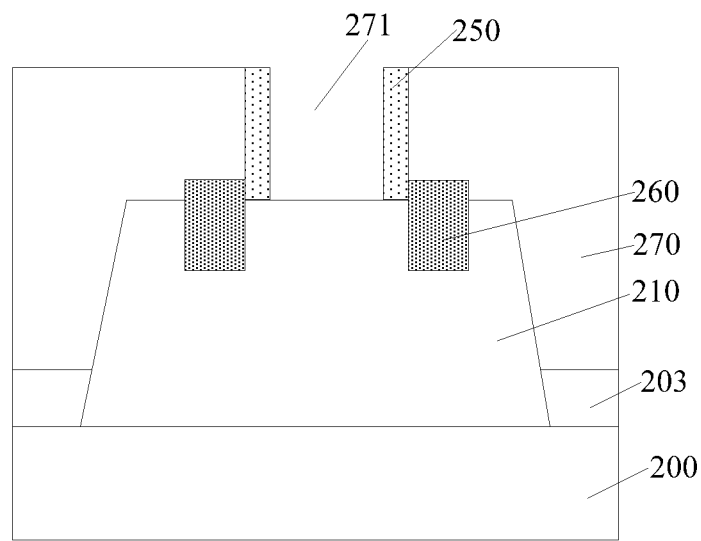
Figure 13B:
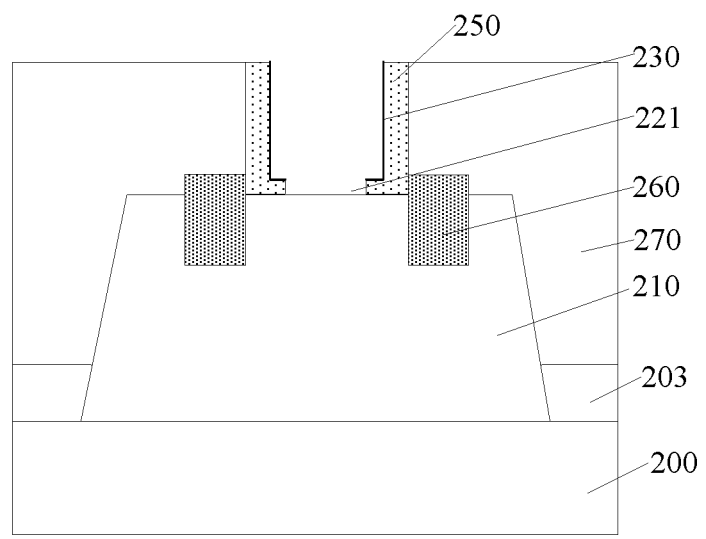

Referring to FIG. 13, a gate opening 271 is formed in the dielectric layer 270 by etching off the first gate electrode layer 230 and the first gate dielectric layer 221, where the sidewall spacers 250 remain on sidewalls of the gate opening 271 (e.g., in 1418 of FIG. 14). In one embodiment, as shown in FIG. 13A, after removing the first gate electrode layer and the first gate dielectric layer, the gate opening has a uniform opening width along the height. In another embodiment, as shown in FIG. 13B, the gate opening 271 has a relatively wider gate opening on the top than at the bottom. For example, each sidewall spacer 250 may be L-shaped along a corresponding sidewall and the bottom of the gate opening 271.

In one embodiment, the source/drain doped regions 260 are elevated so that the top surfaces of the source/drain regions 260 are above overall surface level of the base substrate at bottom of the gate opening 271.

When removing the first gate electrode layer 230 and the first gate dielectric layer 221 by etching, corrosion to the other materials along bottoms of the sidewall spacers 250 is avoided because the sidewall spacers 250 cover the sidewalls of both the first gate electrode layer 230 and the first gate dielectric layer 221. As a result, the following shortcomings are avoided: exposure of the source/drain doped regions 260 through the gate openings 271, short circuits between the source/drain doped regions 260 and other material layers, and current leakage which is also called Inversion Gate Oxide Leakage (IGOXI).

The fabrication method may include a process of forming a second dielectric layer and a second gate electrode layer on the second dielectric layer through the gate opening 271. The second gate dielectric layer covers both sidewall and bottom of the gate opening 271. The second gate dielectric layer may be made of a high-K (K greater than 3.9) dielectric material. The second gate electrode may be made of a metal material.

Correspondingly, another embodiment of the present disclosure provides a semiconductor device fabricated according to the above method.

The semiconductor device includes: a base substrate; a gate structure on the base substrate; source/drain doped regions in the base substrate on sides of the gate structure, where the source/drain regions are doped with source/drain ions; and a dielectric layer covering the base substrate, the source/drain doped regions, and outside sidewall surfaces of the sidewall spacers. The gate structure includes a gate opening, and sidewall spacers, where the sidewall spacer is attached to the sidewalls of the gate opening. The bottom surface of the sidewall spacer is in contact with the base substrate. The tops of the source/drain regions are not below the overall surface level of the base substrate surface at bottom of the gate opening.

Optionally, the process for removing the offset sidewall film and a portion of the first gate dielectric film includes: removing the offset sidewall film followed by removing a portion of the first gate dielectric film surrounding the first gate electrode layer.

Optionally, the process for removing the offset sidewall film includes a wet etching process.

Optionally, the process for removing a portion of the first gate dielectric film includes a wet etching process.

Optionally, when removing a portion of the first gate dielectric film surrounding the first gate electrode layer, a portion of the first gate dielectric film under the first gate electrode layer is removed such that the remaining first gate dielectric film under the first gate electrode layer becomes the first gate dielectric layer. Along the direction of the channel length, the dimension of the first gate dielectric layer is less than the dimension of the first gate electrode layer.

Optionally, along the direction of the channel length, the dimension of the first gate dielectric layer is about 70% to 85% of the dimension of the first gate electrode layer.

Optionally, the first gate dielectric film is made of a silicon oxide material; and the first gate electrode layer is made of a polycrystalline silicon material.

Optionally, the process for forming the first gate dielectric film includes a deposition process or an oxidation process.

Optionally, the process for forming the first gate electrode layer includes: forming a first gate electrode film on the surface of the first gate dielectric film; etching a portion of the first gate electrode film until a surface of the first gate dielectric film is exposed; the remaining first gate electrode film becoming the first gate electrode layer.

Optionally, the material of the offset sidewall film is selected from silicon nitride, silicon oxynitride, carbon silicon oxynitride, nitroborosilicate, nitrocarbon borosilicate, or a combination thereof; the material of the sidewall spacer film is selected from silicon nitride, silicon oxynitride, carbon silicon oxynitride, nitroborosilicate, nitrocarbon borosilicate, or a combination thereof; and the dielectric layer may be made of a silicon oxide material.

Optionally, the sidewall spacer has a thickness greater than the offset sidewall film.

Optionally, a portion of the offset sidewall film may be formed on top of the first gate electrode layer; and the process for forming the offset sidewall film includes an atomic layer deposition process.

Optionally, the process for forming lightly doped regions includes: implanting a light doping of ions into the base substrate on sides of the first gate electrode layer by using the ion implanting process and using the offset sidewall film as a mask to cover sidewalls of the first gate electrode layer.

Optionally, the process for forming sidewall spacers includes: forming a sidewall spacer film on the surfaces of the base substrate surface, sidewall surfaces of both the first gate electrode layer and the first gate dielectric layer, and top of the first gate electrode layer; etching back the sidewall spacer film until a base substrate is exposed, thereby forming the sidewall spacers.

Optionally, the process for forming source/drain doped regions includes forming recesses in the base substrate on sides of the first gate electrode layer, the first gate dielectric layer, and the sidewall spacers; and in the recesses growing source/drain doped regions outwardly.

Optionally, the source/drain doped regions have top surfaces higher than the base substrate at bottom of the gate opening.

Optionally, a second gate dielectric layer and a second gate electrode layer on the second gate dielectric layer may be formed in the gate opening, where the second gate dielectric layer is on both sidewall and bottom of the gate opening; the second gate dielectric layer may be made of a high K dielectric material and the second gate electrode layer may be made of a metal material.

Compared to conventional technologies, the present disclosure provides the following advantages.

In the processes of forming a semiconductor device provided by the present disclosure, the offset sidewall film may be formed on the first gate dielectric film, thereby the offset sidewall film is not in direct contact with the base substrate. The first gate dielectric film under sidewalls of the first gate electrode layer may function as stress buffer layer for the offset sidewall layer covering the sidewalls of the first gate electrode layer, thereby avoiding stress damage from the offset sidewall film to the base substrate. Because the first gate dielectric film surrounding the first gate electrode layer is removed before forming the sidewall spacers, the sidewall spacers cover all of the sidewall surfaces of both the first gate electrode layer and the first gate dielectric layer. The coverage by the sidewall spacers avoids corrosion to other materials located around bottoms of the sidewall spacers when removing the first gate electrode layer and the first gate dielectric layer. Correspondingly, after forming the gate opening, the coverage by the sidewall spacers avoids exposure of the source/drain doped regions through the gate opening, avoids shorting of source/drain regions to other material layers, avoids current leakage, thereby avoids inversion gate oxide leakage (IGOXI). As a result, performance of semiconductor device is increased.

Furthermore, when removing the first gate dielectric film surrounding the first gate electrode layer, a portion of the first gate dielectric film under the first gate electrode is removed and the remaining first gate dielectric film under the first gate electrode layer becomes the first gate dielectric layer. Along the direction of the channel length, the dimension of the first gate dielectric layer is less than the dimension of the first gate electrode layer. As a width of the first gate electrode layer may be maintained fixed or unchanged, the channel length is decreased, thereby decreasing the channel electrical resistance and increasing the drive current of the semiconductor device. The width of the first gate electrode layer is greater than width of the first gate dielectric layer. A relatively wide first gate electrode layer results in a relatively wide gate opening on the top after a subsequent process of removing the first gate electrode layer and first gate dielectric layer. The wide gate opening on the top benefits in a subsequent process of filling in materials for a second gate electrode layer and a second gate dielectric layer.

Additionally, along the direction of the channel length, the dimension of the first gate dielectric layer is less than the dimension of the first gate electrode layer, thus the sidewall spacers have greater thickness where attached to the sidewall of the first gate dielectric layer than where attached to the sidewall of the first gate electrode layer. The thick sidewall spacers where attached to the first gate dielectric layer reduce the parasitic capacitance of the semiconductor device.

Advantages of the present disclosure in a process for fabricating FinFET with reduced IGOXI include: suppressing IGOXI leakage by the double sacrificial layers including the first gate electrode layer and the first gate dielectric layer through deposition and etching (DEP/Etch) processes; removing the IOGOX after polycrystalline silicon removal; under-cutting gate terminal (GT) profile such that the sidewall spacers have greater thickness where attached to the sidewall of the first gate dielectric layer than where attached to the sidewall of the first gate electrode layer; such GT profile may improve both DC and AC performance of the semiconductor device; and no introduction of any mask during the process.

The embodiments disclosed herein are exemplary only. Other applications, alterations, modifications, or equivalents to the disclosed embodiments are obvious to those skilled in the art and are intended to be encompassed within the scope of the present disclosure. The protection of this disclosure is limited by the scope of the claims only.

What is claimed is:

1. A fabrication method of a semiconductor device, comprising:
    providing a base substrate, having a first gate dielectric film thereon;
    forming a first gate electrode layer on a portion of the first gate dielectric film;
    forming an offset sidewall film on the first gate dielectric film, wherein the offset sidewall film covers sidewalls of the first gate electrode layer;
    after forming the offset sidewall film, forming lightly doped regions in the base substrate on sides of the first gate electrode layer;
    after forming the lightly doped regions, removing the offset sidewall film and removing a portion of the first gate dielectric film such that a remaining portion of the first gate dielectric film is under the first gate electrode layer and as a first gate dielectric layer;
    forming sidewall spacers, wherein the sidewall spacers cover sidewall surfaces of both the first gate electrode layer and the first gate dielectric layer;
    forming source/drain doped regions in the base substrate on sides of each of the first gate electrode layer, the first gate dielectric layer, and the sidewall spacers;
    forming a dielectric layer over the source/drain doped regions and the base substrate, wherein the dielectric layer covers sidewall surfaces of the sidewall spacers; and
    forming a gate opening in the dielectric layer by etching off the first gate electrode layer and the first gate dielectric layer, wherein the sidewall spacers remain on sidewalls of the gate opening.

2. The fabrication method according to claim 1, wherein removing the offset sidewall film and removing the portion of the first gate dielectric film include:
    removing the offset sidewall film; and
    after removal of the offset sidewall film, removing the portion of the first gate dielectric film surrounding the first gate electrode layer.

3. The fabrication method according to claim 2, wherein: removing the offset sidewall film includes a wet etching process.

4. The fabrication method according to claim 2, wherein: removing the portion of the first gate dielectric film includes a wet etching process.

5. The fabrication method according to claim 2, wherein removing the portion of the first gate dielectric film surrounding the first gate electrode layer further includes:
    further removing a portion of the first gate dielectric film under the first gate electrode layer, such that a remaining portion of the first gate dielectric film under the first gate electrode layer becomes the first gate dielectric layer, wherein along a direction of a channel length, the first gate dielectric layer has a dimension less than the first gate electrode layer.

6. The fabrication method according to claim 5, wherein: along the direction of the channel length, the first gate dielectric layer has the dimension of about 75% to 85% of a dimension of the first gate electrode layer.

7. The fabrication method according to claim 1, wherein: the first gate dielectric film is made of a silicon oxide material; and
    the first gate electrode layer is made of a polycrystalline silicon material.

8. The fabrication method according to claim 1, wherein: forming the first gate dielectric film includes a deposition process or an oxidation process.

9. The fabrication method according to claim 1, wherein forming the first gate electrode layer includes:
    forming a first gate electrode film on the first gate dielectric film; and
    etching a portion of the first gate electrode film until a surface of the first gate dielectric film is exposed, wherein a remaining portion of the first gate electrode film becomes the first gate electrode layer.

10. The fabrication method according to claim 1, wherein:
    the offset sidewall film is made of a material including silicon nitride, silicon oxynitride, carbon silicon oxynitride, nitroborosilicate, nitrocarbon borosilicate, or a combination thereof;
    the sidewall spacers are made of a material including silicon nitride, silicon oxynitride, carbon silicon oxynitride, nitroborosilicate, nitrocarbon borosilicate or a combination thereof; and
    the dielectric layer is made of a material including silicon oxide.

11. The fabrication method according to claim 1, wherein:
    the sidewall spacer has a thickness greater than the offset sidewall film.

12. The fabrication method according to claim 1, wherein:
    the offset sidewall film is formed further on top of the first gate electrode layer; and
    the offset sidewall film is formed by an atomic layer deposition process.

13. The fabrication method according to claim 1, wherein forming the lightly doped regions includes:
    implanting a light doping of ions into the base substrate on each side of the first gate electrode layer by an ion implanting process, using the offset sidewall film as a doping mask to cover sidewalls of the first gate electrode layer.

14. The fabrication method according to claim 1, wherein forming the sidewall spacers includes:
    forming a sidewall spacer film on the base substrate, on sidewall surfaces of both the first gate electrode layer and the first gate dielectric layer, and on top of the first gate electrode layer; and
    etching back the sidewall spacer film until a surface of the base substrate is exposed, wherein a remaining portion of the sidewall spacer film becomes the sidewall spacers.

15. The fabrication method according to claim 1, wherein forming the source/drain doped regions includes:
    forming recesses in the base substrate on each side of the first gate electrode layer, wherein the recesses are also on each side of the first gate dielectric layer and on each side of the sidewall spacer layer; and
    in the recesses, growing source/drain doped regions outwardly.

16. The fabrication method according to claim 1, wherein top surfaces of the source/drain doped regions are higher than overall surface level of the base substrate at a bottom of the gate opening.

17. The fabrication method according to claim 1, further including:
    forming a second gate dielectric layer in the gate opening, wherein the second gate dielectric layer is on both sidewall and bottom of the gate opening, the second gate dielectric layer being made of a high K dielectric material; and
    forming a second gate electrode layer on the second gate dielectric layer, wherein the second gate electrode layer is made of a metal material.

* * * * *